(12) United States Patent
Tella et al.

(10) Patent No.: US 12,088,279 B2
(45) Date of Patent: Sep. 10, 2024

(54) MULTIFUNCTIONAL LOGIC DEVICE AND METHOD

(71) Applicant: KING ABDULLAH UNIVERSITY OF SCIENCE AND TECHNOLOGY, Thuwal (SA)

(72) Inventors: Sherif Adekunle Tella, Thuwal (SA); Mohammad Ibrahim Younis, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 893 days.

(21) Appl. No.: 17/165,567

(22) Filed: Feb. 2, 2021

(65) Prior Publication Data
US 2021/0242858 A1 Aug. 5, 2021

Related U.S. Application Data

(60) Provisional application No. 62/970,316, filed on Feb. 5, 2020.

(51) Int. Cl.
*H03H 9/24* (2006.01)
*H02N 2/00* (2006.01)
*H03H 9/02* (2006.01)
*H03K 19/02* (2006.01)

(52) U.S. Cl.
CPC ............ *H03H 9/2463* (2013.01); *H02N 2/00* (2013.01); *H03H 9/02259* (2013.01); *H03K 19/02* (2013.01); *H03H 2009/02488* (2013.01)

(58) Field of Classification Search
CPC ............ H03H 9/2463; H03H 9/02259; H03H 2009/02488; H03K 19/02; H02N 2/00; H01L 41/04
USPC ...... 310/365, 348; 331/154, 116 M; 333/186
See application file for complete search history.

(56) References Cited

U.S. PATENT DOCUMENTS 6,497,141 B1 * 12/2002 Turner ................ H03H 9/2405
310/309

OTHER PUBLICATIONS

1:6 Internal Resonance in CMOS-MEMS multi-stepped CC-Beam Resonators Chen et al (Inst of Applied Mechanics, National Taiwan Unit, TaiPei, Taiwan) IEEE 2022 Intl. Conf. on MEM Systems (MEMS) Jul. 22, 2022.*
Efficient Excitation of Micro/Nano Resonators and Their High Order Modes, Jaber et al Jan. 22, 2019 Scientific Reports (Year: 2019).*
Al Hafiz, M.A., et al., "Axially modulated arch resonator for logic and memory applications," Mechatronics, vol. 56, Dec. 2018 (Available online Jan. 17, 2018), pp. 254-260.
(Continued)

*Primary Examiner* — Arnold M Kinkead
(74) *Attorney, Agent, or Firm* — PATENT PORTFOLIO BUILDERS PLLC

(57) ABSTRACT

A logic system includes a microelectromechanical system, MEMS, resonator having an arch beam and first and second side beams, wherein the first side beam is attached with a first end to a first end of the arch beam and the second side beam is attached with a first end to a second end of the arch beam to form a U-shape; an input electrode facing the second side beam; a selector electrode facing the second side beam; a first output electrode facing the first side beam; and a second output electrode facing the arch beam.

20 Claims, 16 Drawing Sheets

(56) References Cited

OTHER PUBLICATIONS

Al Hafiz, M.A., et al., "Axially Modulated Clamped-Guided Arch Resonator For Memory And Logic Applications," Proceedings of the ASME 2017 International Design Engineering Technical Conferences and Computers and Information in Engineering Conference, IDETC/CIE 2017, Cleveland, Ohio, USA, DETC2017-68284, Aug. 6-9, 2017, pp. 1-6.

Azhigulov, D., et al., "The design of universal logic gates using microring resonator structures," Proceedings of SPIE, vol. 10912, Physics and Simulation of Optoelectronic Devices XXVII, Feb. 26, 2019, pp. 1091218-1-1091218-7 (8 pages total).

Hafiz, M.A.A., et al., "A 2:1 MUX based on multiple MEMS resonators," Procedia Engineering, vol. 168, 30th Eurosensors Conference, Eurosensors 2016, Dec. 2016, pp. 1642-1645.

Hafiz, M.A.A., et al., "Microelectromechanical reprogrammable logic device," Nature Communications, vol. 7, Article No. 11137, Mar. 29, 2016, pp. 1-9.

Mita, M., et al., "Microelectromechanical XNOR and XOR logic devices," IEICE Electronics Express, vol. 10, No. 8, Apr. 25, 2013, pp. 1-12.

Roodenburg, D., et al., "Buckling beam micromechanical memory with on-chip readout," Applied Physics Letters, vol. 94, Issue 18, Jun. 2009 (Published online May 4, 2009), pp. 183501-1-183501-3 (4 pages total).

Tella, S.A., et al., "A single MEMS resonator for reconfigurable multifunctional logic gates," Journal of Micromechanics and Microengineering, vol. 28, No. 9, 2018 (Published May 23, 2018), pp. 1-9 (10 pages total).

Tsai, C.-Y., et al., "Design, fabrication and calibration of a novel MEMS logic gate," Journal of Micromechanics and Microengineering, vol. 20, No. 9, 2010 (Published Aug. 17, 2010), pp. 1-11 (12 pages total).

Yao, A., et al., "Logic-memory device of a mechanical resonator," Applied Physics Letters, vol. 105, Issue 12, 2014 (Published online Sep. 22, 2014), pp. 123104-1-123104-4 (5 pages total).

Mahboob, I., et al., "A multimode electromechanical parametric resonator array," Scientific Reports, vol. 4, Article No. 4448, Mar. 24, 2014, pp. 1-8.

* cited by examiner

| Description | Side straight beams | | Arch beam | |
|---|---|---|---|---|
| Length (μm) | $L_2$ | 100 | $L_1$ | 300 |
| Width (μm) | $h_1$ | 2 | $h_2$ | 2 |
| Depth (μm) | $b_1$ | 25 | $b_2$ | 25 |
| Initial curvature (μm) | | | a | 2 |
| Gap between the beams and electrodes (μm) | d | 2 | g | 3 |

FIG. 3

| Selector | Input | Outputs | |
|---|---|---|---|
| S | IN | Out 1 | Out 2 |
| 0 | 0 | 0 | 0 |
| 0 | 1 | 0 | 1 |
| 1 | 0 | 0 | 0 |
| 1 | 1 | 1 | 0 |

FIG. 5

|  | Current NEMS device | Optimized NEMS device | Other techniques | |
| --- | --- | --- | --- | --- |
|  |  |  | CMOS-based technique (32 nm standard) | WDM-based technique |
| Area | 0.03 mm² | 0.000034 mm² | 0.0003 mm² | 0.004 mm² |
| Power consumption | 1.02 µW | 0.61 nW | 0.2 µW | >1 mW |

FIG. 12

APPLYING A FIRST VOLTAGE TO A MICROELECTROMECHANICAL SYSTEM, MEMS, RESONATOR HAVING AN ARCH BEAM AND FIRST AND SECOND SIDE BEAMS, WHEREIN THE FIRST SIDE BEAM IS ATTACHED WITH A FIRST END TO A FIRST END OF THE ARCH BEAM AND THE SECOND SIDE BEAM IS ATTACHED WITH A FIRST END TO A SECOND END OF THE ARCH BEAM TO FORM A U-SHAPE ~1300

APPLYING A SECOND VOLTAGE TO AN INPUT ELECTRODE FACING THE SECOND SIDE BEAM AND A SELECTOR ELECTRODE FACING THE SECOND SIDE BEAM TO TUNE A FIRST RESONANT FREQUENCY OF A FIRST MODE TO A FIRST OPERATING FREQUENCY TO GENERATE A FIRST OUTPUT (OUT1) AT A FIRST OUTPUT ELECTRODE FACING THE FIRST SIDE BEAM ~1302

APPLYING THE SECOND VOLTAGE ONLY TO THE INPUT ELECTRODE AND A ZERO VOLTAGE TO THE SELECTOR ELECTRODE TO TUNE A SECOND RESONANT FREQUENCY OF A SECOND MODE TO A SECOND OPERATING FREQUENCY TO GENERATE A SECOND OUTPUT (OUT2), AT A SECOND OUTPUT ELECTRODE FACING THE ARCH BEAM ~1304

FIG. 13

MULTIFUNCTIONAL LOGIC DEVICE AND METHOD

CROSS-REFERENCE TO RELATED APPLICATIONS

This application claims priority to U.S. Provisional Patent Application No. 62/970,316, filed on Feb. 5, 2020, entitled "MULTIMODE EXCITATIONS FOR COMPLEX MULTI-FUNCTIONAL LOGIC DEVICE," the disclosure of which is incorporated herein by reference in its entirety.

BACKGROUND

Technical Field

Embodiments of the subject matter disclosed herein generally relate to a microelectromechanical system (MEMS) computing device, and more particularly, to a multifunctional logic device that involves multi-input and multi-output lines (MIMO).

Discussion of the Background

Recently, research has been focusing onto exploring MEMS resonators for various applications such as sensors, actuators, filters, switches, memories, and logic gates [1-4]. In this regard, there has been significant interest in using MEMS resonators particularly as digital computing devices due to their run time reprogramability and low-energy consumption, especially in the OFF state. In [5], the bending and buckling effects of a beam, induced by a controlled residual stress, are explored to demonstrate a low-actuation and high-isolation radio frequency (RF) MEMS switch with improved switching performance. A multifunctional logic-memory device based on the nonlinear dynamics of a MEMS resonator incorporated with a closed-loop control was reported in [6]. A logic-memory device was also demonstrated in [7] from a single MEMS clamped-guided arch resonator. The demonstrated dynamic memory and the fundamental logic gates (NOR, XOR and AND gates) were based on the non-linear frequency response and linear frequency modulation of the arch resonator. Coupling configurations of microring resonators was also reported in [8] to demonstrate universal logic gates (NAND and NOR).

Despite the successful demonstration of fundamental and universal logic gates, there are challenges in realizing complex combinational logic gates because multi-input and multi-output lines are required to demonstrate complex combinational logic gates. In view of these challenges, an alternative approach was reported in [9] based on cascading multiple electrothermally switched arch resonators in series to demonstrate a 2:1 MUX, single bit binary comparator and 4-to-2 encoder. Similarly, Mahboob et al. (2014, A multi-mode electromechanical parametric resonator array Sci. Rep. 4, 1-8) reported another approach by encoding the mechanical oscillations of a single parametrically actuated MEMS resonator at different frequencies into multiple channels of binary information to demonstrate universal logic gates with multi-bit logic functions.

However, these alternative approaches are also faced with some obstacles, such as the device complexity and interconnections between the required multiple resonators in the case of cascading resonators in series. In addition, for the case of a single parametrically actuated MEMS resonator, the limit in controllability over the frequency of operations also demands further considerations. Toward these challenges, a novel approach was reported in [10], which is based on electrothermal actuation of a T-shaped resonator, in which multi-input and multi-output complex combinational logic gates were demonstrated. However, electrothermal actuation suffers from poor power efficiency and also can lead to frequency drift due to temperature fluctuations.

In building a complete digital computing device with runtime reconfigurability, it is desired to develop a single conceptual framework that is energy efficient. Thus, there is a need for such a device that can overcome the problems noted above.

BRIEF SUMMARY OF THE INVENTION

According to an embodiment, there is a logic system that includes a microelectromechanical system, MEMS, resonator having an arch beam and first and second side beams, wherein the first side beam is attached with a first end to a first end of the arch beam and the second side beam is attached with a first end to a second end of the arch beam to form a U-shape, an input electrode facing the second side beam, a selector electrode facing the second side beam, a first output electrode facing the first side beam, and a second output electrode facing the arch beam.

According to another embodiment, there is a logic system that includes a substrate extending in a plane, a MEMS resonator having a first side beam, an arch beam, and a second side beam connected in series to each other and attached at only two ends to the substrate, an input electrode facing the second side beam, a selector electrode facing the second side beam, a first output electrode facing the first side beam, and a second output electrode facing the arch beam. The entire arch beam and parts of the first and second side beams are free to move substantially perpendicular to the substrate.

According to still another embodiment, there is a method for generating low and high states with a logic system, and the method includes applying a first voltage to a MEMS resonator having an arch beam and first and second side beams, wherein the first side beam is attached with a first end to a first end of the arch beam and the second side beam is attached with a first end to a second end of the arch beam to form a U-shape; applying a second voltage to an input electrode facing the second side beam and a selector electrode facing the second side beam to tune a first resonant frequency of a first mode to a first operating frequency to generate a first output at a first output electrode facing the first side beam; and applying the second voltage only to the input electrode and a zero voltage to the selector electrode to tune a second resonant frequency of a second mode to a second operating frequency to generate a second output, at a second output electrode facing the arch beam.

BRIEF DESCRIPTION OF THE DRAWINGS

For a more complete understanding of the present invention, reference is now made to the following descriptions taken in conjunction with the accompanying drawings, in which:

FIG. 3 illustrates possible sizes of the MEMS resonator of FIG. 2;

FIG. 5 is a truth table for the logic device of FIG. 1;

FIG. 12 compares the area and power consumption of the device shown in FIG. 1 and a smaller similar device with traditional devices used as logic devices; and FIG. 13 is a flow chart of a method for generating different outputs with a logic device based on a MEMS device.

DETAILED DESCRIPTION OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a U-shaped MEMS microstructure that has plural vibration modes and is actuated and switched electrostatically. However, the embodiments to be discussed next are not limited to a U-shaped MEMS microstructure, but may be applied to other microstructures.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, a novel 1:2 Demux logic device with improved energy efficiency is described. The device is based on the multi-vibration modes of a single MEMS microstructure. The frequencies of operation for the outputs are based on the first and second vibrational modes of the MEMS resonator. The device is made of three mechanically coupled, in-plane, microbeams in the form of a U-shape. The proposed device can be actuated and switched electrostatically. Thus, the proposed device provides a promising platform to demonstrate complex logic functions that require multi-inputs and multi-outputs (MIMO).

Figure 1:
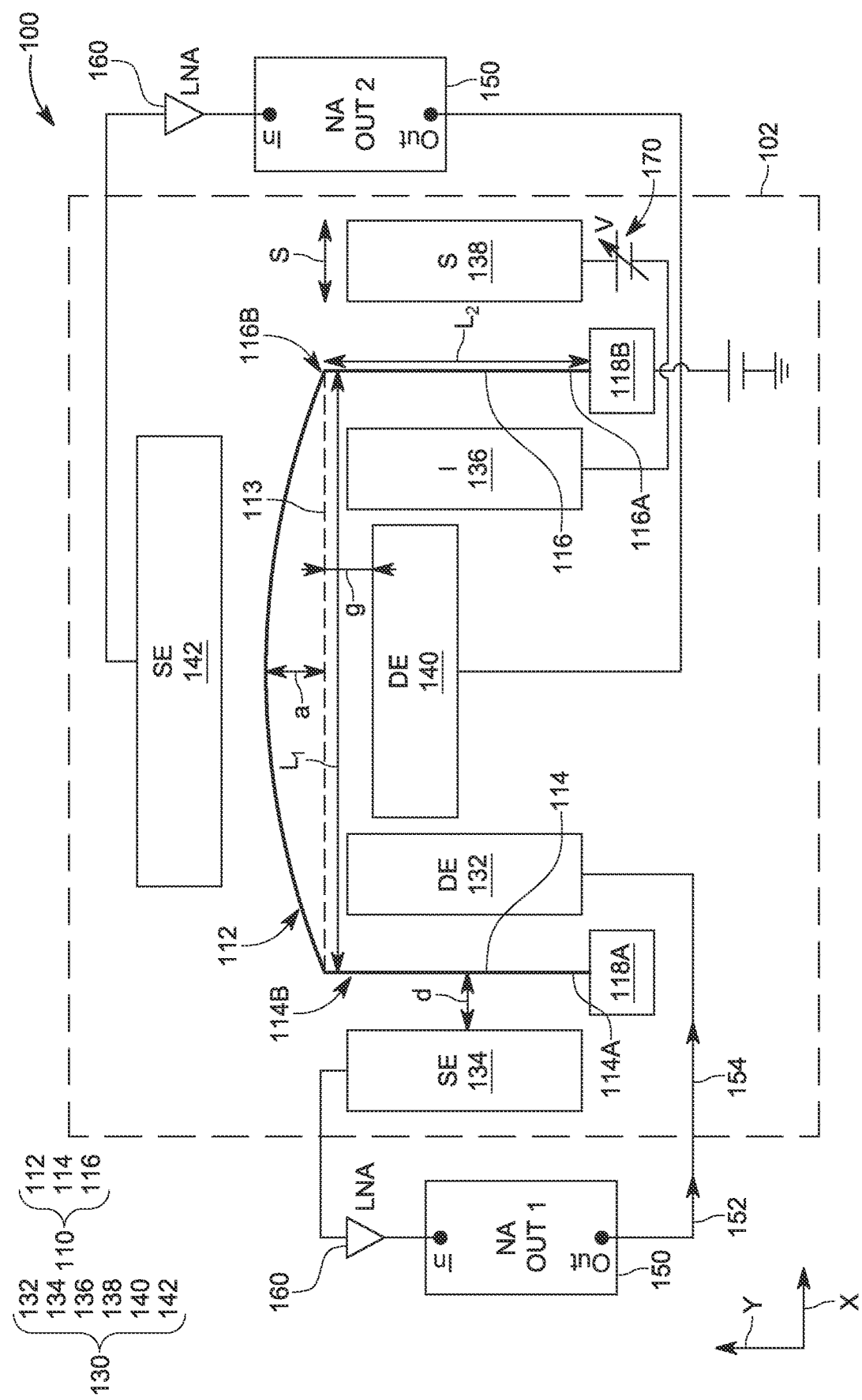
FIG. 1 is a schematic diagram of a logic device having one input line, one selector, and two output lines.
Figure 2:
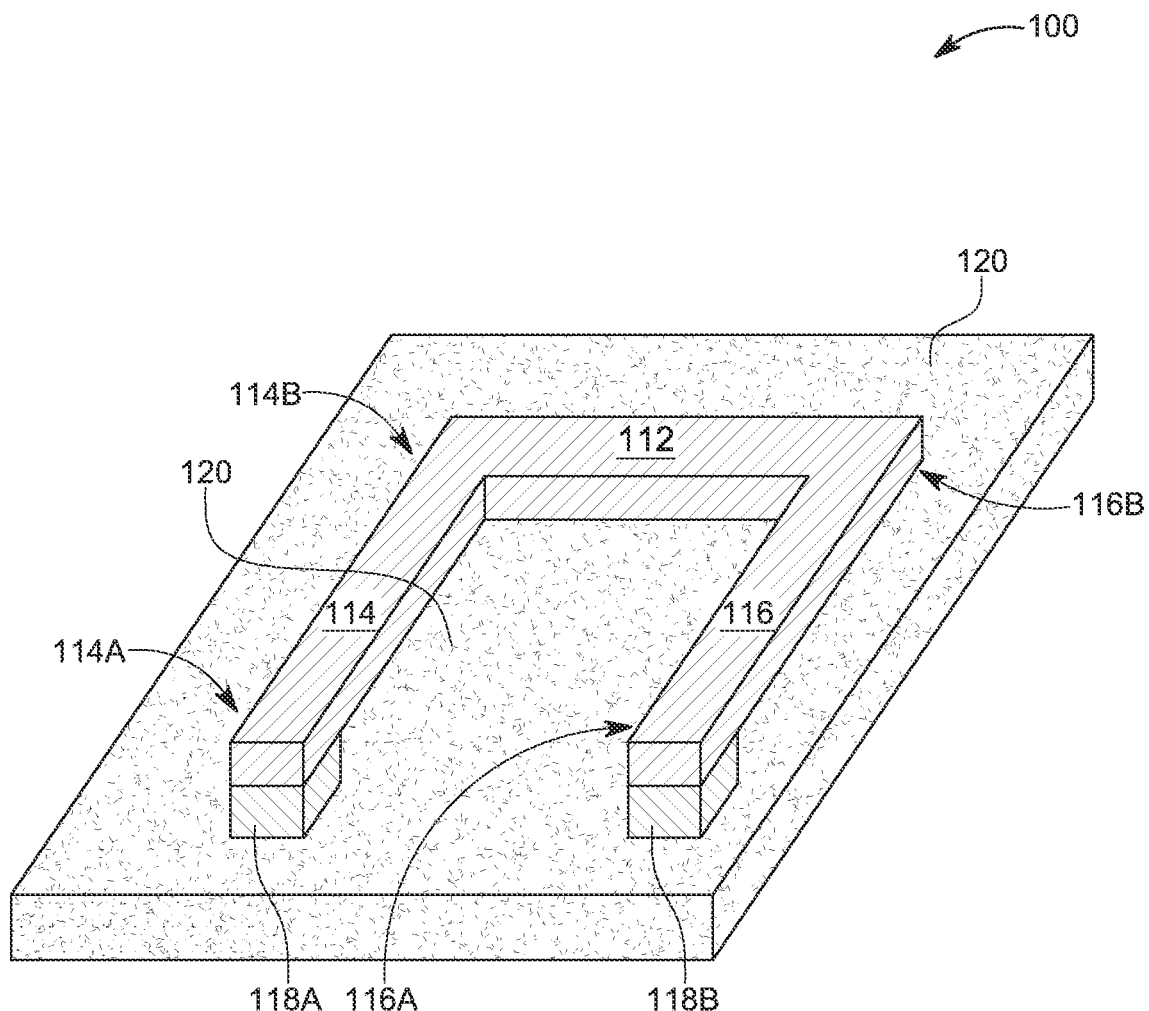
FIG. 2 is a cross-section of a MEMS resonator associated with the logic device of FIG. 1.

A schematic of the fabricated 1:2 Demux logic device 100 is shown in FIG. 1. The device includes a substrate 102 on which the U-shaped MEMS resonator 110 and plural electrodes 130 are formed. The substrate 102 may extend in the plane X-Y. The U-shaped MEMS resonator 110 includes a central, arch beam 112, connected to each end to a corresponding side beam 114 and 116. A single end 114A of the side beam 114 is fixed to a structure 118A, which is attached to the substrate 102, and a single end 116A of the other side beam 116 is fixed to a structure 118B, which is attached to the substrate 102. No other part of the side beams 114 and 116 and the arch beam 112 are attached to the substrate 102. A perspective view of the device 100 is shown in FIG. 2, and it shows that air 120 is present between the entire arch beam 112 and the substrate 102. Also, the other ends 114B and 116B of the side beams 114 and 116 are fully suspended above the substrate 102. The plural electrodes 130 are not shown in FIG. 2 for simplicity.

Returning to FIG. 1, the plural electrodes 130 include a drive electrode DE 132 and a sense electrode SE 134, that are positioned on the substrate 102 to sandwich the first side beam 114. A distance d between the first side beam 114 and the sense electrodes 132 and 134 is shown in the figure. The second side beam 116 is sandwiched between an input electrode I 136, and a selector electrode S 138, while the arch beam 112 is sandwiched between a corresponding drive electrode DE 140 and a corresponding sense electrode SE 142. Note that the arch beam 112 has a maximum displacement from a straight line 113 and the length of the straight line 113, corresponding to the ends of the arch beam 112, is given by L1. A length of the first and second side beams is L2. A distance between the sense and drive electrodes 142 and 140 of the arch beam 112 and the straight line 113 is given by g. In one application, a length of any of the beams is smaller than 400 μm.

The device 100 can be fabricated by MEMSCAP (see description of this method at www.memscap.com/products/mumps/soimumps) based on a two-mask lithography process with a phosphorus dopant into the top surface of the silicon layer of the silicon-on-insulator (SOI) wafer. The designed MEMS resonator 110 has the one arch beam 112 and the two side beams 114 and 116 arranged in-plane to form the single MEMS resonator. The ends 114B and 116B of the side beams 114 and 116 are used to guide and control the ends of the arch beam 112, i.e., to compress and extend the arch beam. In other words, the side beams 114 and 116 are used to induce either tensile or compressive electrostatic axial loads on the arch beam 112. The side beams also can be used as sensing and actuating electrodes.

The stiffness and resonant frequencies of an arch microbeam can be controlled and tuned by applying either tensile or compressive axial loads as these actions change the static and dynamic behavior of the arch beam. The applied axial loads, with one or both the side beams 114 and 116 on the arch beam 112, can lead to competing effects between the initial curvature a of the arch beam and the applied axial load. Depending on the dominant effect, the resonant frequency of the arch beam 112 can either increase or decrease. Based on these observations, the inventors have selected the arch beam 112 and the side beams 114 and 116 such that they give the required frequency shifts necessary to perform logic operations. In this embodiment, the controllability and tunability of the frequency responses for the first and second modes of the MEMS resonator 110 are used to select the operating frequencies to implement the logic operation. The dimensions of the three in-plane microbeams 112, 114, and 116 that form the MEMS resonator 110 are listed in the table in FIG. 3. Those skilled in the art would understand that these numbers are provided as an example, but other dimensions could be used.

The device 100 was experimentally characterized using a network analyzer NA 150 and a low-noise amplifier (LNA) 160, which are connected in series, between the drive electrode 132 and the sense electrode 134 for generating a first output OUT1, and also between the drive electrode 140 and the sense electrode 142 for generating a second output OUT2, as illustrated in FIG. 4. This is so because for demonstrating the complex logic function, two outputs are required. Thus, the sensing electrodes of the first side beam 114 and the arch beam 112 are used as the outputs while the corresponding driving electrodes are used to excite the structure into the required modes of vibrations. The tensile electrode 136 and the compressive electrode 138 of the second side beam 116 are used as input and selector, respectively.

The electrostatic actuation for the driving electrodes 132 and 140 is achieved with an in-built AC signal 152 from the network analyzer 150, which is superimposed with a DC voltage 154 from a DC supply, which may be part of the network analyzer 150. The generated vibrations due to the electrostatic actuation induces motional currents in the sense electrodes 134 and 142. These form the output currents that are amplified by the LNA 160. The outputs from the LNA 160 are connected to the input ports of the network analyzer 150 for S21 transmission measurements. For the demonstrated logic function of the device illustrated in FIG. 1, the arch beam 112 and the first side beam 114 are biased with a first given voltage, e.g., 15 V DC voltage and an AC signal of −20 dBm (22.361 mVrms) at a pressure of 500 mTorr and at room temperature. Note that the beams 112 to 116 may be used at other pressures.

Figure 4A:
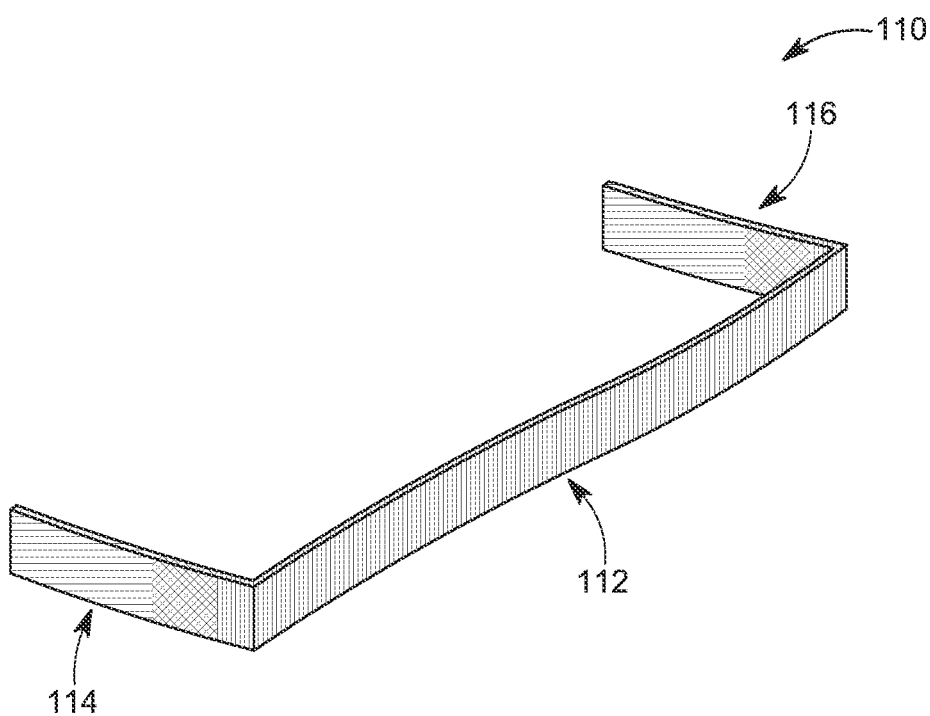
FIG. 4A illustrates a first mode and FIG. 4B illustrates a second mode associated with the MEMS resonator of FIG. 2.
Figure 4B:
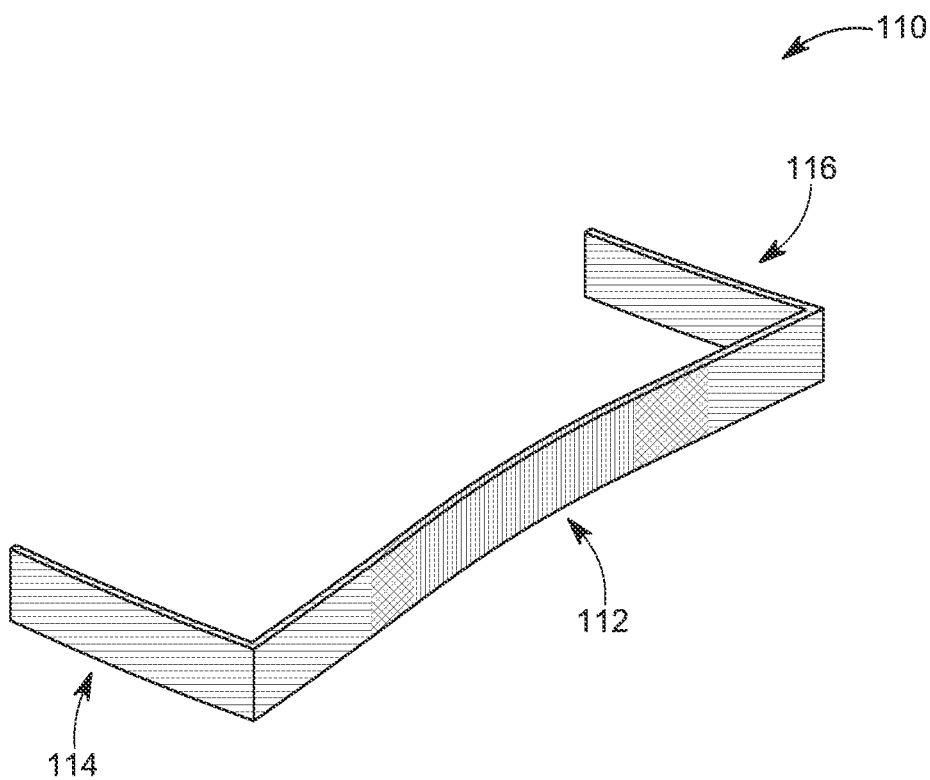

The vibrational modes discussed above were modeled with a finite element based commercial software, for the 3D MEMS resonator 110 when made with polysilicon material, using a free tetrahedral mesh with custom element size with 570,112 degrees of freedom. Although the MEMS resonator 110 can be considered as a single integrated microstructure, the finite element simulation indicates interactions between the distinct localized modes of the individual beams 112 to 116. FIG. 4A shows the first mode of vibration of the MEMS resonator 110 and FIG. 4B shows the second mode of vibration of the MEMS resonator 110. It can be observed that the vibration for the first mode is localized and dominant around the side beams 114 and 116 (sway mode) and that of the second mode is localized and dominant around the arch beam 112. These modes can be locally vibrated around their dominant domains with minimum effect on each other. These dominant modes can be excited and are used to implement the complex multifunctional logic gate in this embodiment.

Prior to explaining how to implement the logic functions of the device 100, the tunability of the modes illustrated in FIGS. 4A and 4B was investigated. Note that the tunability of the modes is only carried out for varying voltages applied to the input and selector electrodes 136 and 138 that are necessary to perform the logic function, as shown in the truth table in FIG. 5. More specifically, the selector in the table corresponds to the selector electrode 138, the input corresponds to the input electrode 136, the output Out 1 is read from the sensing electrode 134 and the output Out 2 is read from sensing electrode 142. In one application, the outputs Out 1 and Out 2 are frequencies, which are determined by the network analyzer 150. The tunability of both modes are obtained experimentally by varying an electrostatic DC voltage V applied on the second side beam 116 with the input electrode 136 and the selector electrode 138. In this regard, FIG. 1 shows a DC voltage source 170 that applies the DC voltage V to the electrodes 136 and 138.

The resonant frequencies for the first and second modes are measured to be around f1=95.49 kHz and f2=105.6 kHz, respectively. When the DC voltage V is applied between the input/selector electrode 136/138 and the second side beam 116, an axial tensile/compressive stress S is induced in the device 100, which modulates the resonant frequencies f1 and f2 of both modes, and thereby changes the dynamic behavior of the device 100, qualitatively and quantitatively.

Figure 6A:
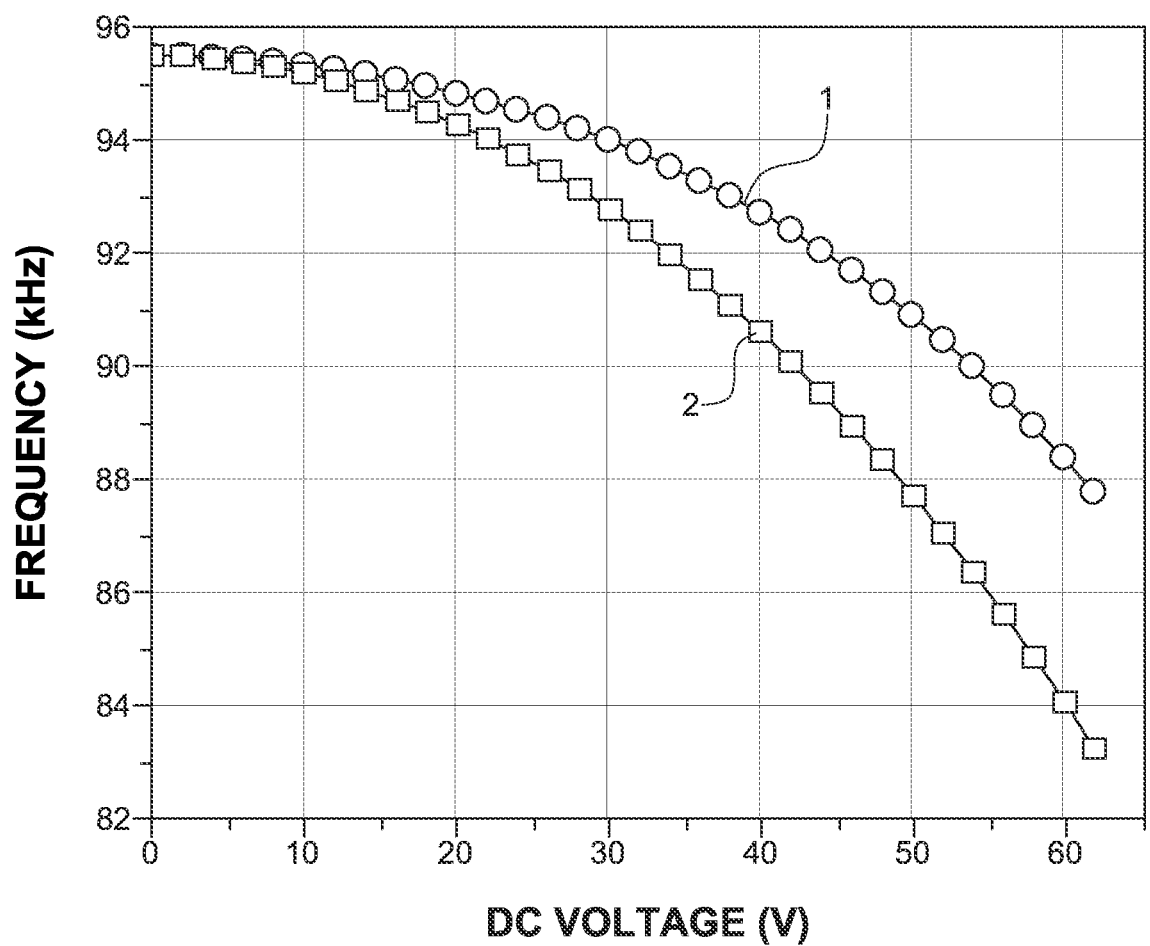
FIG. 6A shows how a resonant frequency associated with the first mode varies when a voltage is applied to a selector of the MEMS resonator, or to the selector and an input of the MEMS resonator.
Figure 6B:
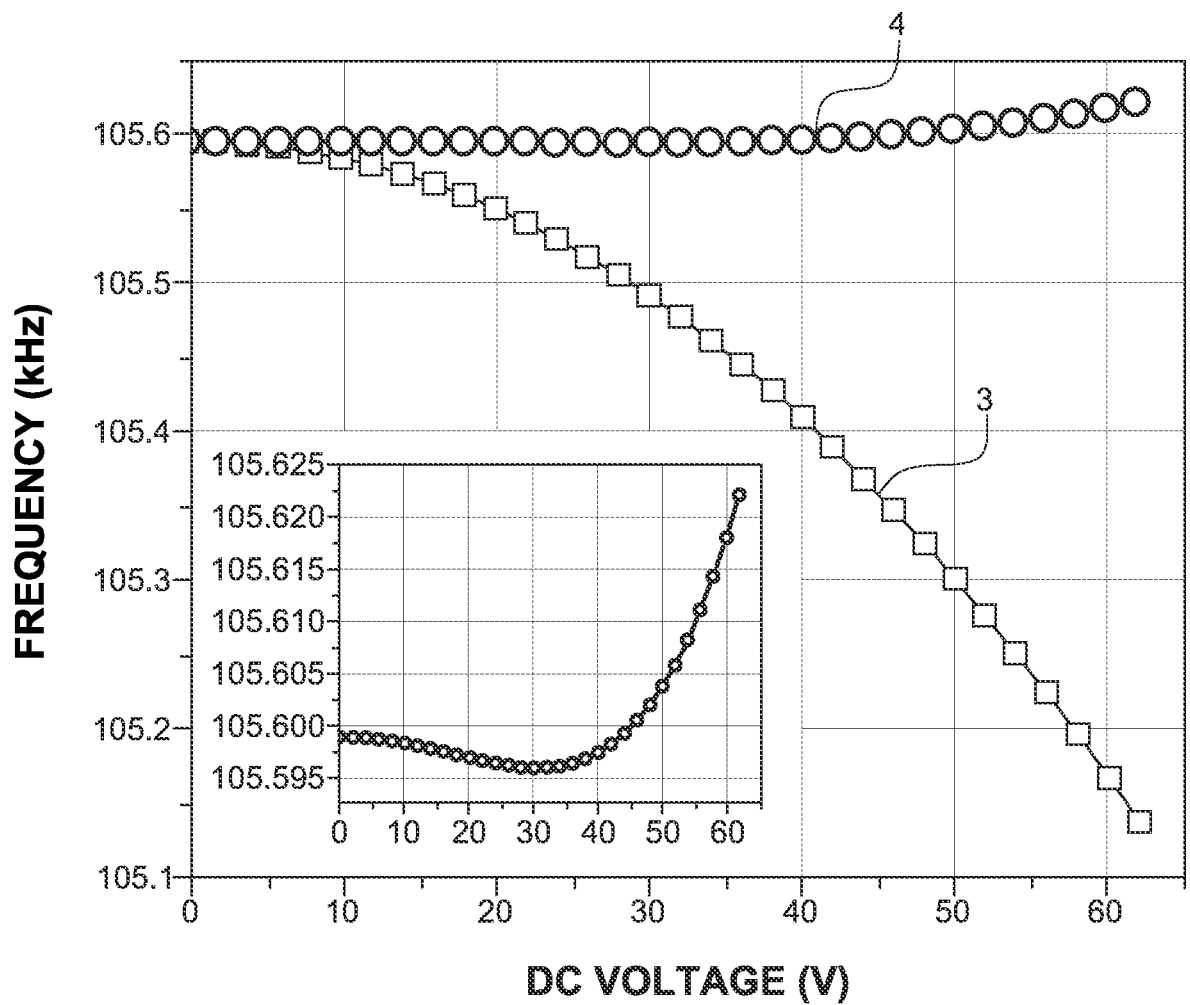
FIG. 6B shows how a resonant frequency associated with the second mode varies when a voltage is applied only to the selector of the MEMS resonator, or only to the input of the MEMS resonator.

As shown in FIG. 6A, there is a steady decrease in the resonant frequency (represented on the Y axis) of the first mode as the DC voltage V (represented on the X axis) increases for both cases, (1) when only the selector electrode 138 is in an ON state, and (2) when both the input electrode 136 and the selector electrode 138 are in the ON state. The corresponding logical values for the output OUT1 are shown in FIG. 5. Similar results are obtained for the resonant frequency 3 of the second mode, as shown in FIG. 6B, when only the input electrode 136 is in the ON state. However, the resonant frequency 4 of the second mode when only the selector electrode 138 is in the ON state shows a different qualitative result. The resonant frequency 4 decreases until it gets to a critical point, after which it increases as the voltage increases, as shown in the zoom-in view in FIG. 6B. It was reported in the art that this observed phenomenon is due to the competing effect between the initial curvature of the arch beam and the applied tensile axial load from the selector. It can be observed that the tunability of the first mode (see FIG. 6A) to both the input and the selector electrodes shows a wider range when compared to the second mode (see FIG. 6B). This is due to the fact that the first mode is being dominant around the tensile and compressive axial electrodes that are used as the input and selector electrodes. This induces a significant effect on the first mode. However, the response of the second mode is only localized and dominant around the upper and lower electrodes 140 and 142 of the arch beam 112 (as shown in FIG. 4B), which are only used in this case as the sensing and actuating electrodes, respectively.

With these observations, a novel demultiplexer can be implemented based on the device 100 shown in FIG. 1 as now discussed. A demultiplexer (or demux) is an electronic device that takes a single input signal that can be routed to one of several digital output lines and it is often referred to as a single input, multi-output switch. A demux of $2^n$ output lines has n selectors that select which output lines to route the input signal. A 1:2 demux 700 discussed now with regard to FIGS. 7A and 7B, which are the schematic and circuit diagrams, respectively, has two output lines 710 and 712, and hence requires only one selector 702. The selector electrode 138 (see FIG. 1) is used to route the single input signal from the input electrode 136 to one of the two output lines 710 and 712, which correspond to the sense electrodes 134 and 142 of the first side beam 114 and the arch beam 112, respectively.

Figure 7A:
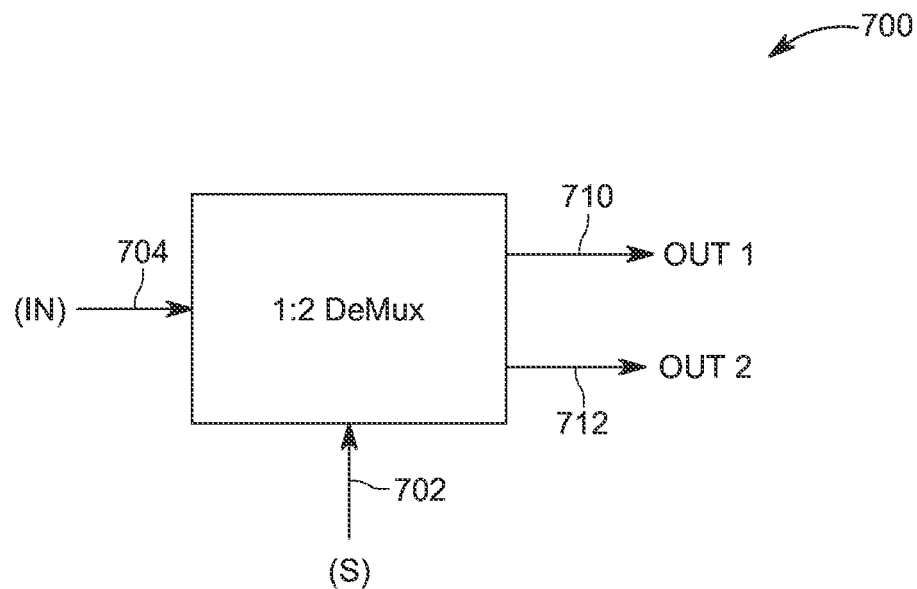
FIG. 7A is a schematic diagram of the logic device and FIG. 7B is a circuit diagram of the logic device.
Figure 7B:
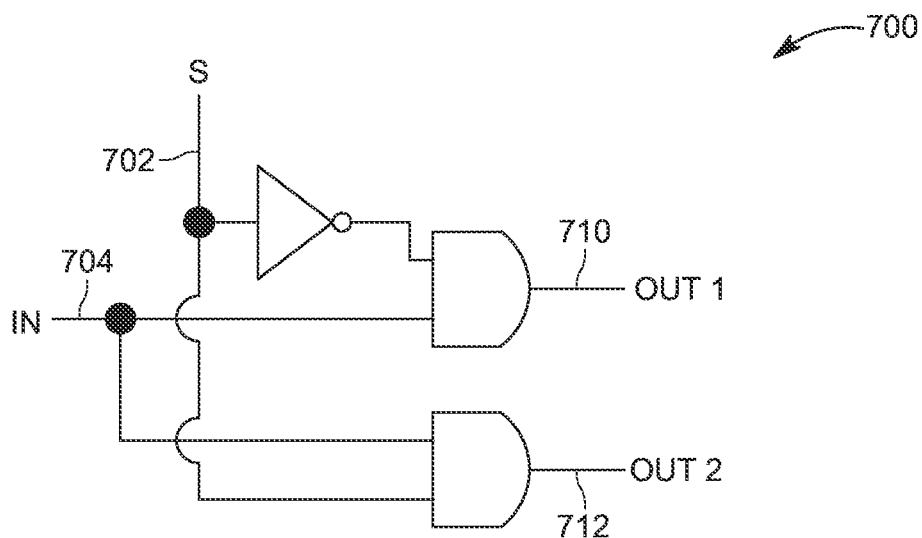

The truth table shown in FIG. 5 describes the 1:2 demux 700 illustrated in FIGS. 7A and 7B. As indicated in the truth table, the input signal is routed to output OUT2 only when the selector 702 is in the OFF state and the input line 704 is in the ON state (i.e., S=0 and IN=1, which corresponds to line 3 in FIG. 6B). However, when the selector 702 is in the ON state and the input line 704 is also in the ON state (i.e., S=1 and IN=1), the input line is routed to output OUT1 (corresponding to line 2 in FIG. 6A). The corresponding second given voltages in this embodiment, for the OFF and the ON states for both the selector 0(1) and the input 0(1) are 0 V and 30 V, respectively. It is noted that the electrostatic forces applied by the input and selector electrodes when the voltage 30V is on do not cancel each other. This is different from a classical structure, such as a fixed-fixed straight beam or cantilever beam under static loading, where the same opposite forces will cancel out each other. For the present case of the U-shaped structure, the forces applied by the input and selector electrodes do not cancel out each other because the U-shaped structure is a coupled structure in which the arch and the first side beam are under dynamic loading. Thus, the second side beam is also under dynamic loading before applying the 30V because of the coupled structure. Hence, when the 30V is applied on both the input and selector electrodes, it would have different effects on both the arch beam and the first side beam. This is one of the unique property of the U-shape structure. Further, the 30V applied on the input and selector electrodes is not intended for static displacement, but to have an effect on the resonant frequency of the vibrational modes. This is verified experimentally and with simulations as illustrated in FIG. 6A. As shown in FIG. 6A (corresponding to line 2), when S=IN=0, the frequency is around 95 kHz, but when S=IN=30, the frequency is around 93 kHz. Thus, by applying various voltages to the input and selector electrodes the operation frequency of the U-shaped structure is changed to another frequency. For instance, when S=IN=40, the frequency is around 91 kHz or when S=IN=50, the frequency is around 88 KHz.

Figure 8A:
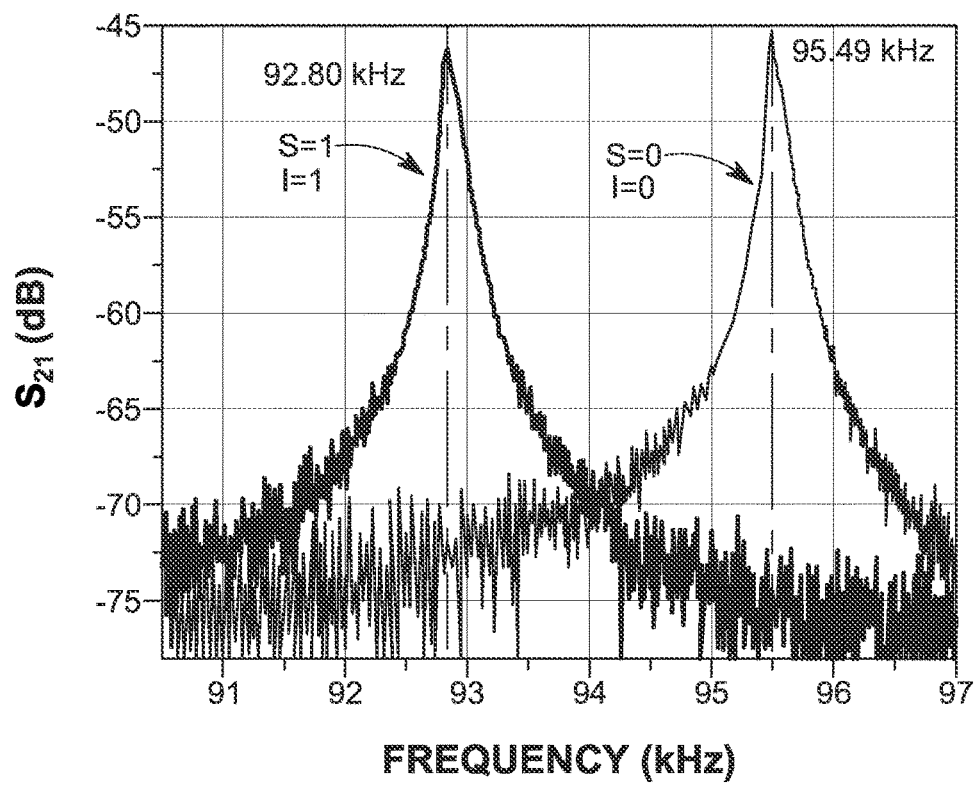
FIG. 8A shows the frequency response of the first mode for a first output and FIG. 8B shows the frequency response of the second mode for a second output.
Figure 8B:
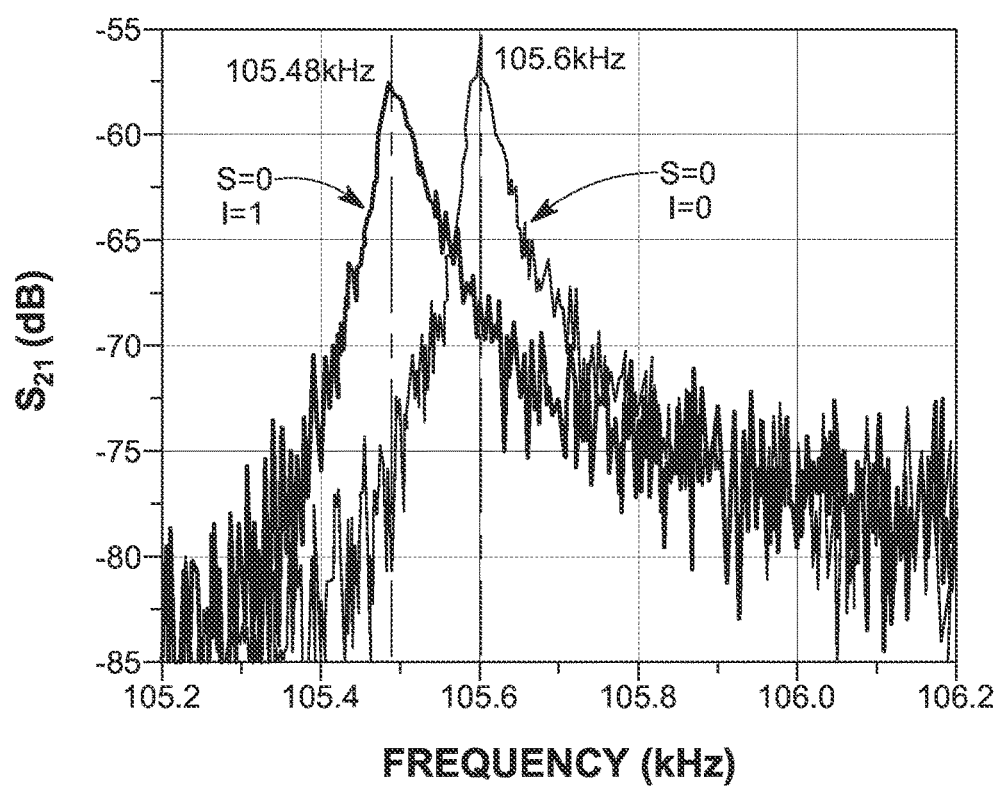

FIGS. 8A and 8B show the S21 transmission measurements (measured with the network analyzer 150) for both output lines 710 and 712. The natural frequencies for the first and second modes are 95.49 kHz and 105.6 kHz, respectively, and the operating frequencies for output OUT1 and output OUT2 are selected to be 92.8 kHz and 105.48 KHz, respectively, based on the measured values obtained from the tunability of both modes (see FIGS. 6A and 6B). By activating a DC voltage of 30 V on the input 136 while the selector 138 is in the OFF state (i.e., S=0 and IN=1, which corresponds to curve 4 in FIG. 6B), the resonant frequency of the second mode is tuned to 105.48 KHz, as shown in FIG. 8B, which is the operating frequency for output OUT2. However, when a DC voltage of 30 V is applied on both the input and the selector (i.e., S=1 and IN=1, which corresponds to curve 2 in FIG. 6A), the resonant frequency of the first mode is tuned to 92.80 kHz, as shown in FIG. 8A, which is the operating frequency for output OUT1. Thus, the device 100 can be used to act as a 1:2 demux device 700.

Figure 9A:
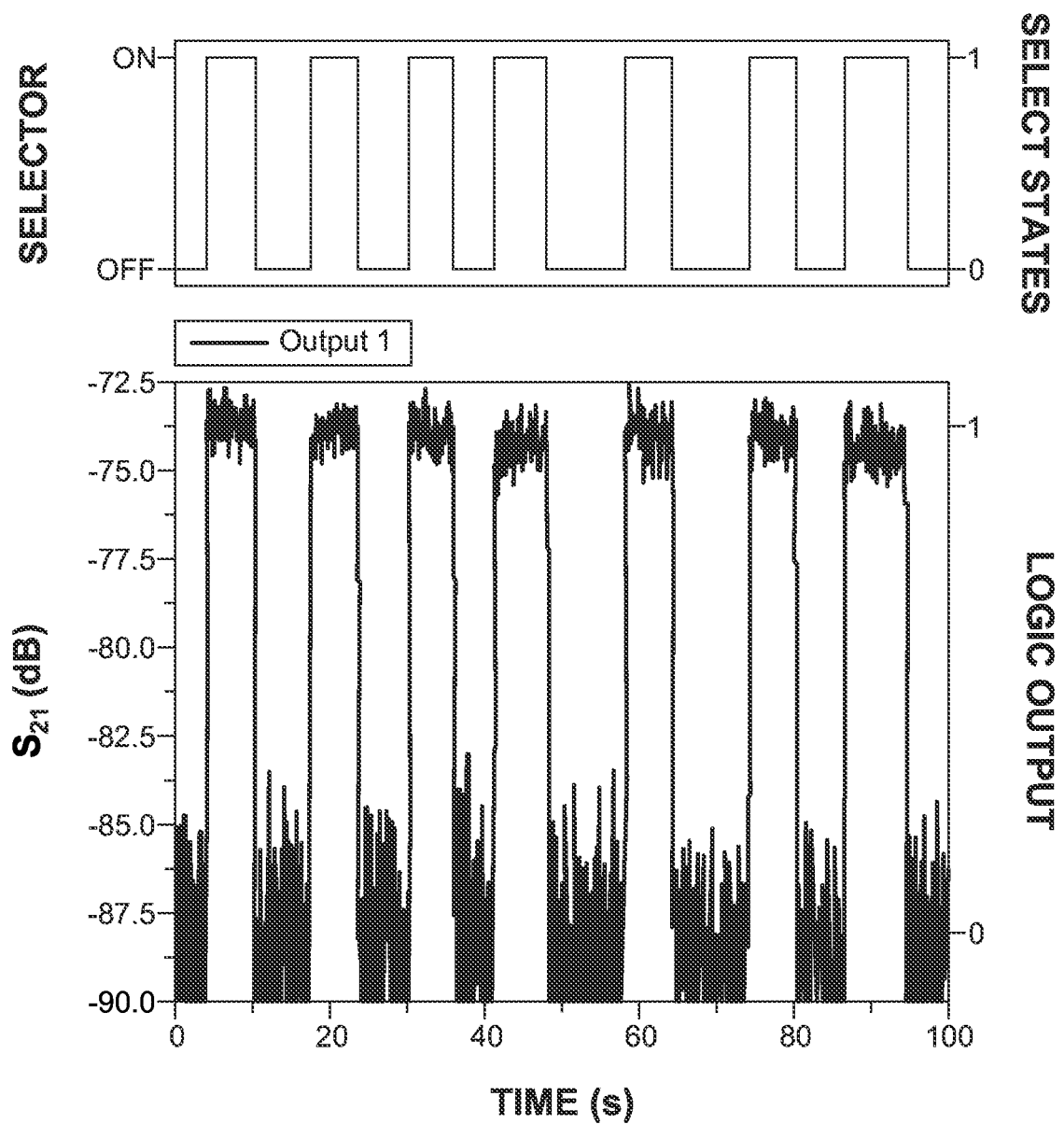
FIG. 9A shows the time response for the first output and FIG. 9B shows the time response for the second output.
Figure 9B:
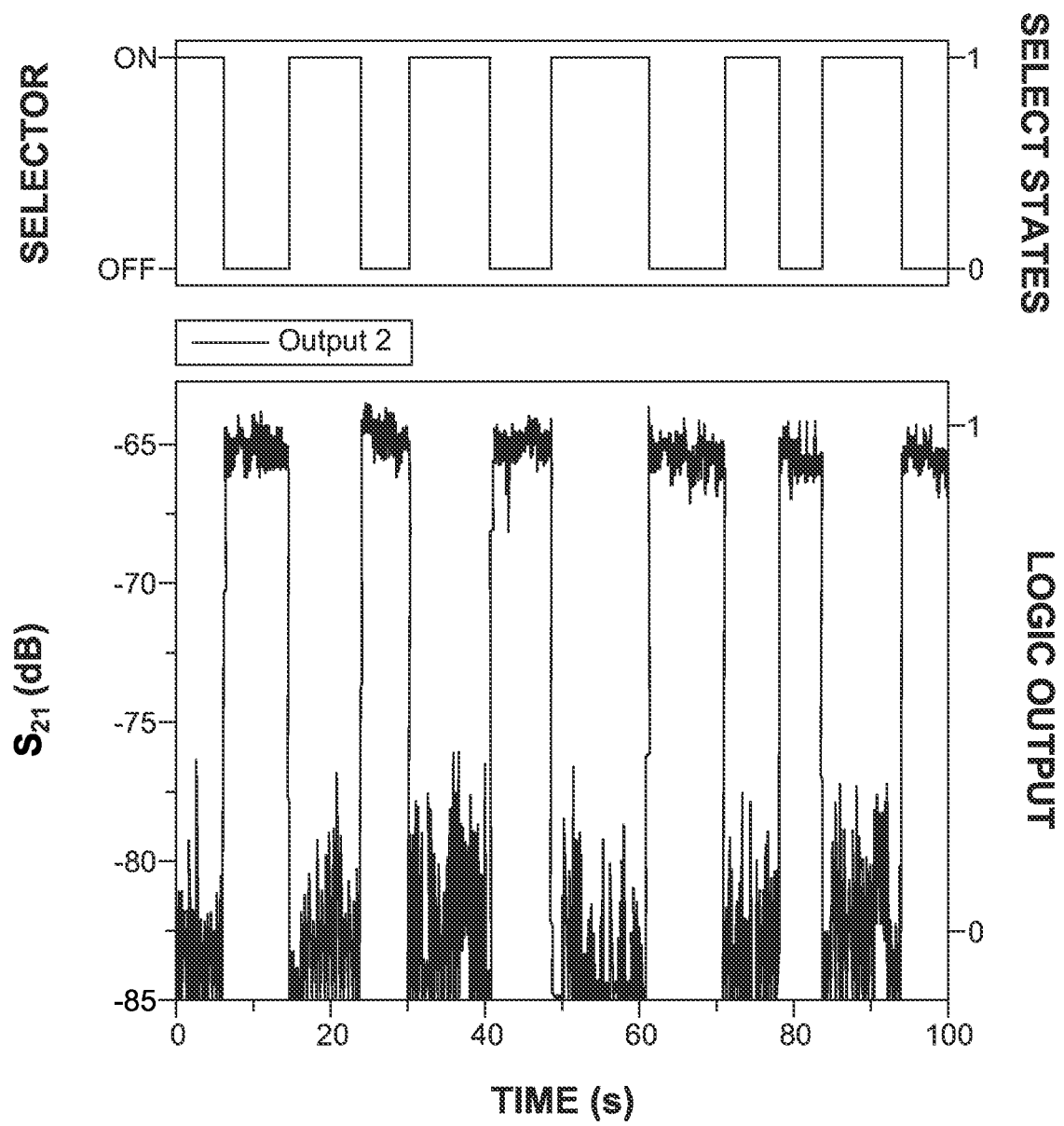

The time responses showing the selector line and the logic outputs are depicted in FIGS. 9A and 9B. For output OUT1, the logic output will be in state '1' (i.e., high-state) when the selector line 702 is switched on; however, for output OUT2, the logic output will be in the high-state only when the input line 704 is ON, but the selector line 702 is not triggered, i.e., it is in the OFF state.

To be able to have a realistic MEMS computing device, it is necessary to evaluate the operating speed, the switching energy, and the actuation energy of the MEMS resonator 110, to assess its performance as a potential computing device. The operating speed of the single MEMS device 100 can be estimated based on the f/Q quantity, where f is the operating resonant frequency and Q is the quality factor. As previously discussed, the operating resonant frequencies for mode 1 and mode 2 are 92.80 kHz and 105.48 KHz, respectively, and their corresponding Q are 2058.14 and 2457.50, respectively. Thus, by using the quantity above that depends on f and Q, the switching speed for the first mode is found to be 45 Hz and for the second mode is found to be 43 Hz, and their corresponding switching times are 22 ms and 23 ms, respectively. These switching times are considered to be high in comparison with the existing CMOS devices. However, such slow computing devices can be suitable for many domestics and industrial applications such as IoT devices, where very fast computations are not required for data processing.

Figure 10A:
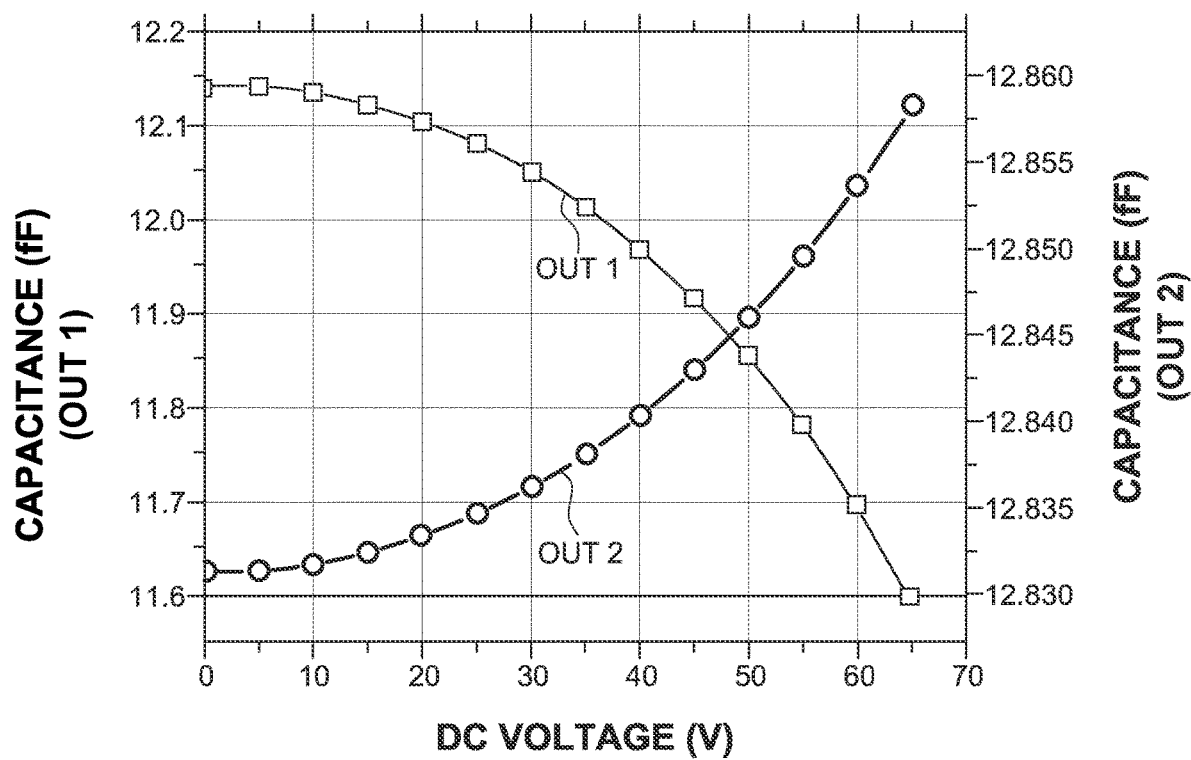
FIG. 10A illustrates how the capacitance of the system varies when only the selector is in the ON state, and when both the selector and the input are in the ON state.
Figure 10B:
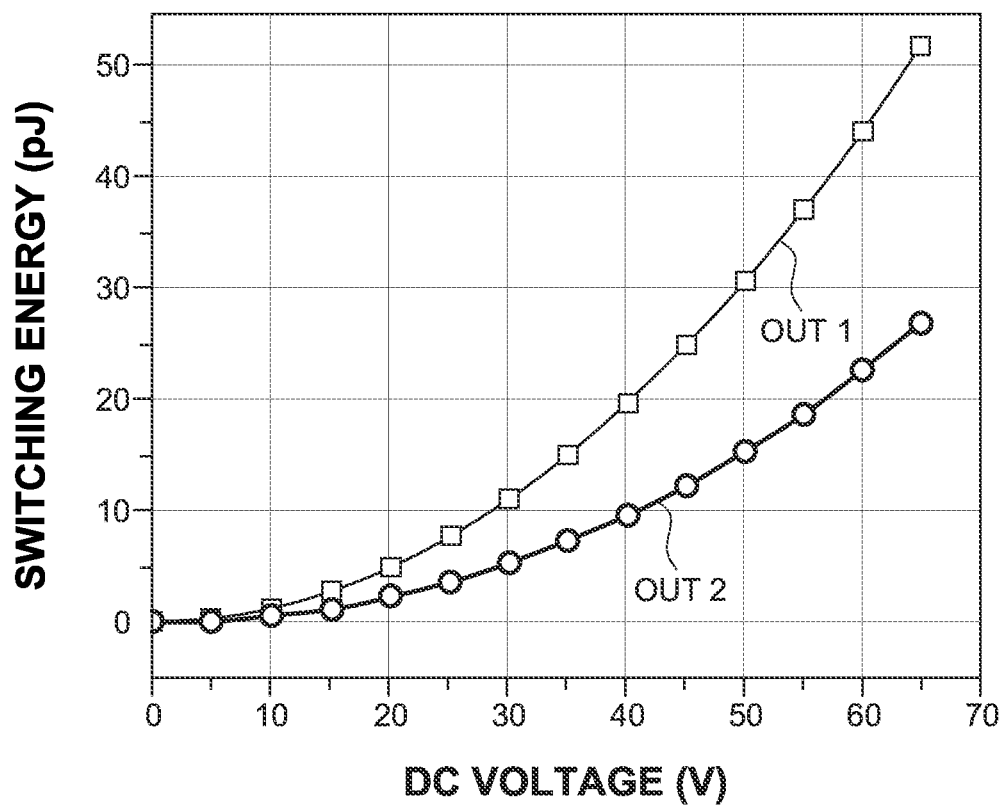
FIG. 10B illustrates how the switching energy changes when only the selector is in the ON state, and when both the selector and the input are in the ON state.

Because the switching is triggered through the electrostatic force, the switching energy per logic operation can be estimated based on the principle of energy stored in a capacitor. A modeling software was used to simulate the changes in the capacitance and the switching energy as the applied voltage changes for the high state (i.e., state '1') of each output. Alternatively, the switching energy can be evaluated using the relationship $$\frac{1}{2}C(\Delta V^2),$$

which is based on the average of the consumed energy for different input combinations. For the switching voltage V of 30 V, as shown in FIGS. 10A and 10B, the corresponding capacitance and the switching energy for output OUT1 are 12.54 fF and 11.01 pJ, respectively, and for output OUT2, they are 11.72 fF and 5.31 pJ, respectively. When only the selector is in the ON state, the change in capacitance and the switching energy increase as the DC voltage increases for output OUT2. However, there is a continuous decrease in capacitance and steady increase in switching energy when both the input and the selector are in ON state, for output OUT1. This indicates about 75% decrease in switching energy per logic operation in comparison to the previously reported values [7] for electrostatically actuated MEMS resonator-based computing devices. However, it should be noted that the MEMS resonator device 100 requires a continuous source of energy to sustain its oscillation and this will lead to a constant leakage of energy through the small motional current. Such a drawback can be alleviated by designing AC-based electromechanical logic devices.

Figure 11A:
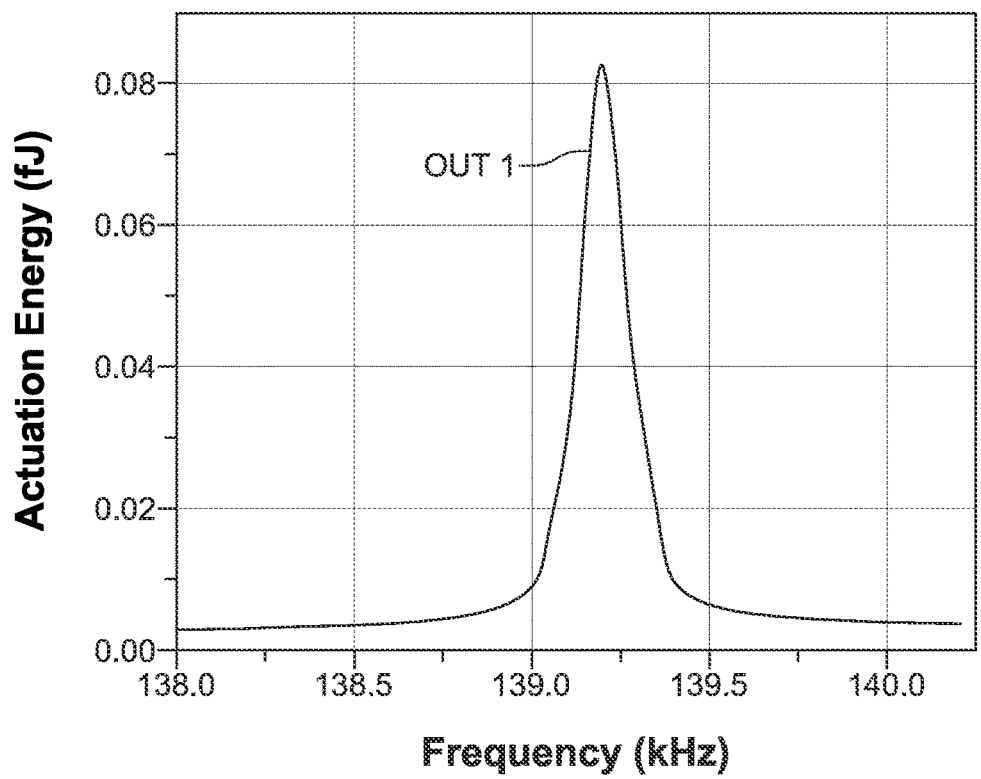
FIG. 11A illustrates the variation of the actuation energy with the frequency for the first mode and FIG. 11B shows the same for the second mode.
Figure 11B:
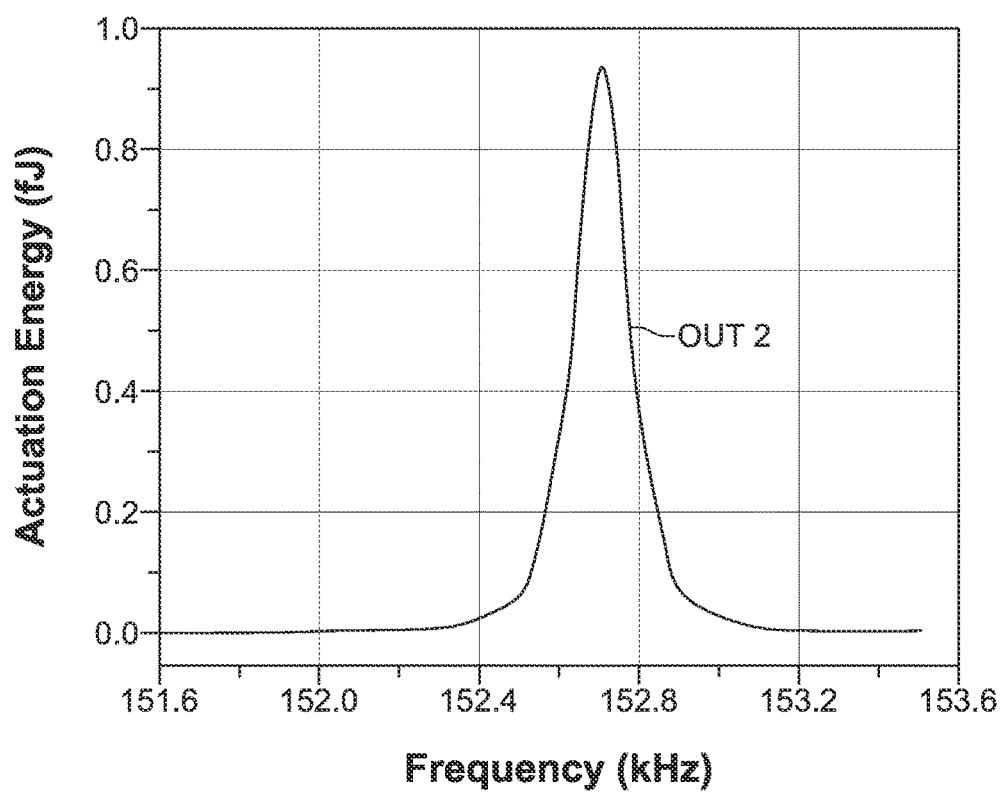

Another parameter to be considered for the resonator-based computing device is the actuation energy. The actuation energy is the energy required to excite the system into its resonant frequencies. It consists of a DC voltage superimposed with an AC source. The actuation energies for mode 1 and mode 2 are obtained to be 0.082 fJ and 0.91 fJ, respectively, using the MEMS module in the modeling software discussed above, as shown in FIGS. 11A and 11B. Note that the residual stress is not considered in the numerical simulation and this is the reason the resonant frequencies for both modes are different from the experimentally obtained resonant frequencies. It can be deduced from the obtained actuation energy that the resonator based computing device 700 is energy efficient, especially when it is based on AC actuation only. FIG. 12 shows the geometrical area and power consumption of the current device 100 and that of a proposed more optimized nanoscale device (NEMS) as compared to other existing technologies used for implementing the demux operation. The dimensional area of the optimized NEMS device is 30 smaller than the current device and it is simulated to obtain the power performance.

MEMS resonators can be subjected to severe mechanical shocks because they are used in a wide range of devices. The shock survivability of the studied device is estimated to be in the range of 40,000-70,000 g. However, by miniaturizing the device, its stiffness and resistance to shock will significantly improve. Although this may lead to more actuation power to operate the stiffer devices, this can be reduced by reducing the dimension of the capacitive gap g.

The design and operation of a multi-inputs and multi-outputs MEMS resonator 110 for multi-functional logic device, with improved energy efficiency and using the multi-modes of a single MEMS microstructure were discussed. The operating frequencies for the logic outputs are based on the first and the second vibrational modes of the device. The modulations of the resonance frequencies are provided through axial electrostatic loads from one of the side beams. This device 100 shows improvement on the energy per logic operation, with about 75% decrease in comparison with the previously reported values for electrostatically actuated MEMS resonator-based computing devices. Thus, the proposed microstructure provides a promising platform to demonstrate complex multifunctional logic device that require multi-input and multi-output lines with improved energy efficiency.

A logic system that includes one or more of the structures discussed above is now discussed. The logic system 100 includes the MEMS resonator 110 having an arch beam 112 and first and second side beams 114, 116, where the first side beam 114 is attached with a first end 114B to a first end of the arch beam 112 and the second side beam 116 is attached with a first end 116B to a second end of the arch beam 112 to form a U-shape. The logic system also includes an input electrode 136 facing the second side beam 116, a selector electrode 138 facing the second side beam 116, a first output electrode 134 facing the first side beam 114, and a second output electrode 142 facing the arch beam 112.

In the logic system discussed above, a second end of the first side beam and a second end of the second side beam are fixedly attached to a substrate. In one application, only the second end of the first side beam and only the second end of the second side beam out of the first side beam, the second side beam, and the arch beam are attached to the substrate. In still another application, the entire arch beam is floating above the substrate. The MEMS resonator has first and second resonant frequencies.

The logic system may also include a first driving electrode that together with the first output electrode sandwich the first side beam, and a second driving electrode that together with the second output electrode sandwich the arch beam. The first driving electrode and the second driving electrode drive the MEMS structure at a first operating frequency or a second operating frequency. The first operating frequency is smaller than the first resonant frequency, and the second operating frequency is smaller than the second resonant frequency. The first operating frequency is changed to the first resonant frequency when the first and second driving electrodes are biasing the MEMS resonator with a given first voltage, and the input electrode and the selector electrode apply a given second voltage. Alternatively, the second operating frequency is changed to the second resonant frequency when the first and second driving electrodes are biasing the MEMS resonator with the given first voltage, the input electrode applies the given second voltage, and the selector electrode applies a zero voltage. In one application, a length of the arch beam, the first side beam and the second side beam is smaller than 400 μm.

In a different embodiment, the logic system 100 includes a substrate 102 extending in a plane XY, a MEMS resonator 110 having a first side beam 114, an arch beam 112, and a second side beam 116 connected in series to each other and attached at only two ends to the substrate 102, an input electrode 136 facing the second side beam 116, a selector electrode 138 facing the second side beam 116, a first output electrode 134 facing the first side beam 114, and a second output electrode 142 facing the arch beam 112. The entire arch beam and parts of the first and second side beams are free to move substantially perpendicular to the substrate.

In one application, a second end of the first side beam and a second end of the second side beam are fixedly attached to a substrate. For example, only the second end of the first side beam and only the second end of the second side beam out of the first side beam, the second side beam, and the arch beam are attached to the substrate. Thus, the entire arch beam is floating above the substrate.

According to an embodiment illustrated in FIG. 13, a method for generating low and high states with the logic system 100 is now discussed. The method includes a step 1300 of applying a first voltage to a microelectromechanical system, MEMS, resonator having an arch beam and first and second side beams, wherein the first side beam is attached with a first end to a first end of the arch beam and the second side beam is attached with a first end to a second end of the arch beam to form a U-shape, a step 1302 of applying a second voltage to an input electrode facing the second side beam and a selector electrode facing the second side beam to tune a first resonant frequency of a first mode to a first operating frequency to generate a first output (OUT1) at a first output electrode facing the first side beam, and a step 1304 of applying the second voltage only to the input electrode and a zero voltage to the selector electrode to tune a second resonant frequency of a second mode to a second operating frequency to generate a second output (OUT2), at a second output electrode facing the arch beam.

The method may further include a step of generating the first operating frequency by applying a first voltage to the MEMS resonator with first and second driving electrodes, where the first driving electrode together with the first output electrode sandwich the first side beam, and where the second driving electrode together with the second output electrode sandwich the arch beam. In one application, a second end of the first side beam and a second end of the second side beam are fixedly attached to a substrate. Thus, only the second end of the first side beam and only the second end of the second side beam out of the first side beam, the second side beam, and the arch beam are attached to the substrate. This mean that the entire arch beam is floating above the substrate.

The disclosed embodiments provide a multifunctional logic device that is based on a MEMS resonator. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] Al Hafiz A, Tella S, Alcheikh N, Fariborzi H and Younis M I, 2017, Axially modulated clamped-guided arch resonator for memory and logic applications, *Proc. of the ASME Design Engineering Technical Conf.*, (*Cleveland, OH*) pp 1-6.
[2] Hafiz M A A, Kosuru L and Younis M I, 2016, Microelectromechanical reprogrammable logic device *Nat. Commun.* 7 1-9.
[3] Mita M, Ataka M and Toshiyoshi H, 2013, Microelectromechanical XNOR and XOR logic devices, *IEICE Electron. Express* 10 1-12.
[4] Tsai C and Chen T, 2010, Design, fabrication and calibration of a novel MEMS logic gate, *J. Micromech. Microeng.* 20 095021.
[5] Roodenburg D, Spronck J W, Van Der Zant H S J and Venstra W J, 2009, Buckling beam micromechanical memory with on-chip readout, *Appl. Phys. Lett.* 94 1-4.
[6] Yao A and Hikihara T, 2014, Logic-memory device of a mechanical resonator *Appl. Phys. Lett.* 105 1-5.
[7] Hafiz M A A, Tella S, Alcheikh N, Fariborzi H and Younis M I, 2018, Axially modulated arch resonator for logic and memory applications, *Mechatronics* 56 254-60.
[8] Azhigulov D, Ukaegbu I A and Park H, 2019, The design of universal logic gates using microring resonator structures, *Proc. SPIE* 10912 1-7.
[9] Hafiz M A A, Kosuru L, Younis M I and Fariborzi H, 2016, A 2:1 MUX based on multiple MEMS resonators, 168 1642-5.
Tella S A, Alcheikh N and Younis M I, 2018, A single MEMS resonator for reconfigurable multifunctional logic gates, *J. Micromech. Microeng.* 28 1-9.

What is claimed is:

1. A logic system comprising:
a microelectromechanical system, MEMS, resonator having an arch beam and first and second side beams, wherein the first side beam is attached with a first end to a first end of the arch beam and the second side beam is attached with a first end to a second end of the arch beam to form a U-shape;
an input electrode facing the second side beam;
a selector electrode facing the second side beam;
a first output electrode facing the first side beam; and
a second output electrode facing the arch beam.

2. The logic system of claim 1, wherein a second end of the first side beam and a second end of the second side beam are fixedly attached to a substrate.

3. The logic system of claim 2, wherein only the second end of the first side beam and only the second end of the second side beam out of the first side beam, the second side beam, and the arch beam are attached to the substrate.

4. The logic system of claim 2, wherein the entire arch beam is floating above the substrate.

5. The logic system of claim 1, wherein the MEMS resonator has first and second resonant frequencies.

6. The logic system of claim 5, further comprising:
a first driving electrode that together with the first output electrode sandwich the first side beam; and
a second driving electrode that together with the second output electrode sandwich the arch beam.

7. The logic system of claim 6, wherein the first driving electrode and the second driving electrode drive the MEMS structure at a first operating frequency or a second operating frequency.

8. The logic system of claim 7, wherein the first operating frequency is smaller than the first resonant frequency, and the second operating frequency is smaller than the second resonant frequency.

9. The logic system of claim 7, wherein the first operating frequency is changed to the first resonant frequency when the first and second driving electrodes are biasing the MEMS resonator with a given first voltage, and the input electrode and the selector electrode apply a given second voltage.

10. The logic system of claim 7, wherein the second operating frequency is changed to the second resonant frequency when the first and second driving electrodes are biasing the MEMS resonator with a given first voltage, the input electrode applies a given second voltage, and the selector electrode applies a zero voltage.

11. The logic system of claim 1, wherein a length of the arch beam, the first side beam and the second side beam is each smaller than 400 μm.

12. A logic system comprising:
a substrate extending in a plane;
a microelectromechanical system, MEMS, resonator having a first side beam, an arch beam, and a second side beam connected in series to each other and attached at only two ends to the substrate;
an input electrode facing the second side beam;
a selector electrode facing the second side beam;
a first output electrode facing the first side beam; and
a second output electrode facing the arch beam,
wherein the entire arch beam and parts of the first and second side beams are free to move substantially perpendicular to the substrate.

13. The logic system of claim 12, wherein a second end of the first side beam and a second end of the second side beam are fixedly attached to the substrate.

14. The logic system of claim 13, wherein only the second end of the first side beam and only the second end of the second side beam out of the first side beam, the second side beam, and the arch beam are attached to the substrate.

15. The logic system of claim 13, wherein the entire arch beam is floating above the substrate.

16. A method for generating low and high states with a logic system, the method comprising:
applying a first voltage to a microelectromechanical system, MEMS, resonator having an arch beam and first and second side beams, wherein the first side beam is attached with a first end to a first end of the arch beam and the second side beam is attached with a first end to a second end of the arch beam to form a U-shape;
applying a second voltage to an input electrode facing the second side beam and a selector electrode facing the second side beam to tune a first resonant frequency of a first mode to a first operating frequency to generate a first output (OUT1) at a first output electrode facing the first side beam; and applying the second voltage only to the input electrode and a zero voltage to the selector electrode to tune a second resonant frequency of a second mode to a second operating frequency to generate a second output (OUT2), at a second output electrode facing the arch beam.

17. The method of claim 16, further comprising:
generating the first operating frequency by applying a first voltage to the MEMS resonator with first and second driving electrodes,
wherein the first driving electrode together with the first output electrode sandwich the first side beam, and
wherein the second driving electrode together with the second output electrode sandwich the arch beam.

18. The method of claim 16, wherein a second end of the first side beam and a second end of the second side beam are fixedly attached to a substrate.

19. The method of claim 18, wherein only the second end of the first side beam and only the second end of the second side beam out of the first side beam, the second side beam, and the arch beam are attached to the substrate.

20. The method of claim 18, wherein the entire arch beam is floating above the substrate.

* * * * *